US012051617B2

(12) United States Patent
Hsu et al.

(10) Patent No.: US 12,051,617 B2
(45) Date of Patent: *Jul. 30, 2024

(54) METHOD OF MAKING A SEMICONDUCTOR DEVICE AND SEMICONDUCTOR DEVICE

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Min Han Hsu, Hsinchu (TW); Chun-Chang Chen, Hsinch (TW); Jung-Chih Tsao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/816,051

(22) Filed: Jul. 29, 2022

(65) Prior Publication Data

US 2022/0384253 A1    Dec. 1, 2022

Related U.S. Application Data

(63) Continuation of application No. 16/801,706, filed on Feb. 26, 2020, now Pat. No. 11,450,557.

(30) Foreign Application Priority Data

Jan. 7, 2020   (CN) ......................... 202010013805.5

(51) Int. Cl.
*H01L 21/768*    (2006.01)
*H01L 21/033*    (2006.01)
(Continued)

(52) U.S. Cl.
CPC .... *H01L 21/76807* (2013.01); *H01L 21/0332* (2013.01); *H01L 21/0337* (2013.01);
(Continued)

(58) Field of Classification Search
CPC ......... H01L 21/76807; H01L 21/76877; H01L 21/76811; H01L 21/0337; H01L 21/0332
See application file for complete search history.

(56) References Cited

U.S. PATENT DOCUMENTS

| | | |
|---|---|---|
| 6,514,844 B1 | 2/2003 | Martin et al. |
| 7,199,046 B2 | 4/2007 | Wetzel et al. |

(Continued)

FOREIGN PATENT DOCUMENTS

| | | |
|---|---|---|
| CN | 104701143 | 6/2015 |
| TW | 200908146 | 2/2009 |
| TW | 201722709 | 8/2017 |

OTHER PUBLICATIONS

Office Action dated Nov. 11, 2020 for corresponding case No. TW 10921092840. (pp. 1-4).

*Primary Examiner* — Bac H Au
(74) *Attorney, Agent, or Firm* — Hauptman Ham, LLP (57) ABSTRACT

A method includes depositing a metallic hardmask over a dielectric layer. The method further includes etching a metallic hardmask opening in the metallic hardmask to expose a top surface of the dielectric layer. Th method further includes modifying a sidewall of the metallic hardmask opening by adding non-metal atoms into the metallic hardmask. The method further includes depositing a conductive material in the metallic hardmask opening.

20 Claims, 7 Drawing Sheets

(51) Int. Cl.
*H01L 21/285* (2006.01)
*H01L 21/288* (2006.01)
*H01L 21/311* (2006.01)
*H01L 23/528* (2006.01)
*H01L 23/532* (2006.01)

(52) U.S. Cl.
CPC .... *H01L 21/28568* (2013.01); *H01L 21/2885* (2013.01); *H01L 21/31111* (2013.01); *H01L 21/31144* (2013.01); *H01L 21/76873* (2013.01); *H01L 21/76877* (2013.01); *H01L 23/5283* (2013.01); *H01L 23/53228* (2013.01)

(56) References Cited

U.S. PATENT DOCUMENTS

| | | | |
|---|---|---|---|
| 8,586,478 B2 | 11/2013 | Soda et al. | |
| 9,059,250 B2 | 6/2015 | Choi et al. | |
| 9,412,648 B1 | 8/2016 | Shiu et al. | |
| 9,659,811 B1 | 5/2017 | Peng et al. | |
| 9,728,501 B2 | 8/2017 | Chang et al. | |
| 9,929,012 B1 | 3/2018 | Belyansky et al. | |
| 10,347,528 B1 | 7/2019 | Singh et al. | |
| 10,672,705 B2 | 6/2020 | Xu et al. | |
| 11,018,052 B2 | 5/2021 | Yang | |
| 11,450,557 B2 * | 9/2022 | Hsu | H01L 21/76873 |
| 2002/0102854 A1 | 8/2002 | Givens et al. | |
| 2003/0129842 A1 | 7/2003 | Wang et al. | |
| 2006/0091559 A1 | 5/2006 | Nguyen et al. | |
| 2010/0197133 A1 | 8/2010 | Werner et al. | |
| 2012/0187546 A1 | 7/2012 | Akinmade-Yusuff et al. | |
| 2012/0302068 A1 | 11/2012 | Chen | |
| 2013/0095652 A1 | 4/2013 | Harada et al. | |
| 2013/0183825 A1 | 7/2013 | Liou et al. | |
| 2013/0313717 A1 | 11/2013 | Holmes et al. | |
| 2014/0038412 A1 | 2/2014 | Hu et al. | |
| 2014/0113438 A1 | 4/2014 | Usami | |
| 2015/0162240 A1 | 6/2015 | Chiu | |
| 2015/0162280 A1 | 6/2015 | Pan et al. | |
| 2015/0221549 A1 | 8/2015 | Ponoth et al. | |
| 2017/0125353 A1 | 5/2017 | Chen et al. | |
| 2019/0237331 A1 | 8/2019 | Lu et al. | |

* cited by examiner

METHOD OF MAKING A SEMICONDUCTOR DEVICE AND SEMICONDUCTOR DEVICE

PRIORITY CLAIM

The present application is a continuation of U.S. application Ser. No. 16/801,706, filed Feb. 26, 2020, issued as U.S. Pat. No. 11,450,557 on Sep. 20, 2022, which claims priority to the China Patent Application No. 202010013805.5, filed Jan. 7, 2020, which are incorporated herein by reference in their entireties.

BACKGROUND

Dual damascene interconnects provide reliable interconnections between layers of an integrated circuit. Voids in interconnects increase electrical resistance and reduce overall reliability of an integrated circuit, and slow the clock speed of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When manufacturing a semiconductor device or integrated circuit having dual damascene interconnects, the conductive material added to the dual damascene structure opening is added in at least two processes. After the trench and via openings are formed in one or more layers of dielectric materials, a layer of seed material is deposited into the trench and via openings. A layer of seed material is also deposited against underlying conductive material at the bottom of the dual damascene structure opening before bulk conductive material is added to the dual damascene structure. In some instances, the seed material, or seed layer, is sputtered onto the sidewalls of the dual damascene structure, and on an exposed portion of the underlying conductive material. The seed layer comprises, in some embodiments, pure copper or a copper alloy. The bulk conductive material is filled into the dual damascene structure opening by electroplating, which results in a filled dual damascene structure and a layer of conductive material on a top surface of the die where the dual damascene structure is being formed. In some embodiments, electroplated bulk conductive material is copper or a copper alloy. In some embodiments, the seed layer and the electroplated bulk conductive material are the same alloy. In some instances, the seed layer and the electroplated bulk conductive material are different materials, to promote adhesion of the seed layer to a liner on a sidewall of a dual damascene structure and/or reduction of voids in the electroplated bulk conductive material.

Because electroplating of conductive materials is sensitive to the diffusion rate of materials into openings such as dual damascene structures, obstructions or features that promote non-uniform seed layer deposition impact the flow of dissolved ions of conductive materials into dual damascene structures during electroplating processes. Restriction of ions of conductive material into openings leads to the formation of voids in the resulting interconnection structure, with concomitant increases in resistance of the interconnection structure above a threshold interconnection structure resistance for an integrated circuit.

Reduction and/or elimination of voids in interconnection structures leads to an overall reduction in the resistance of the integrated circuit containing the interconnection structures. Lowered resistance also contributes to a faster overall switching time for the transistors of the integrated circuit.

Figure 1A:
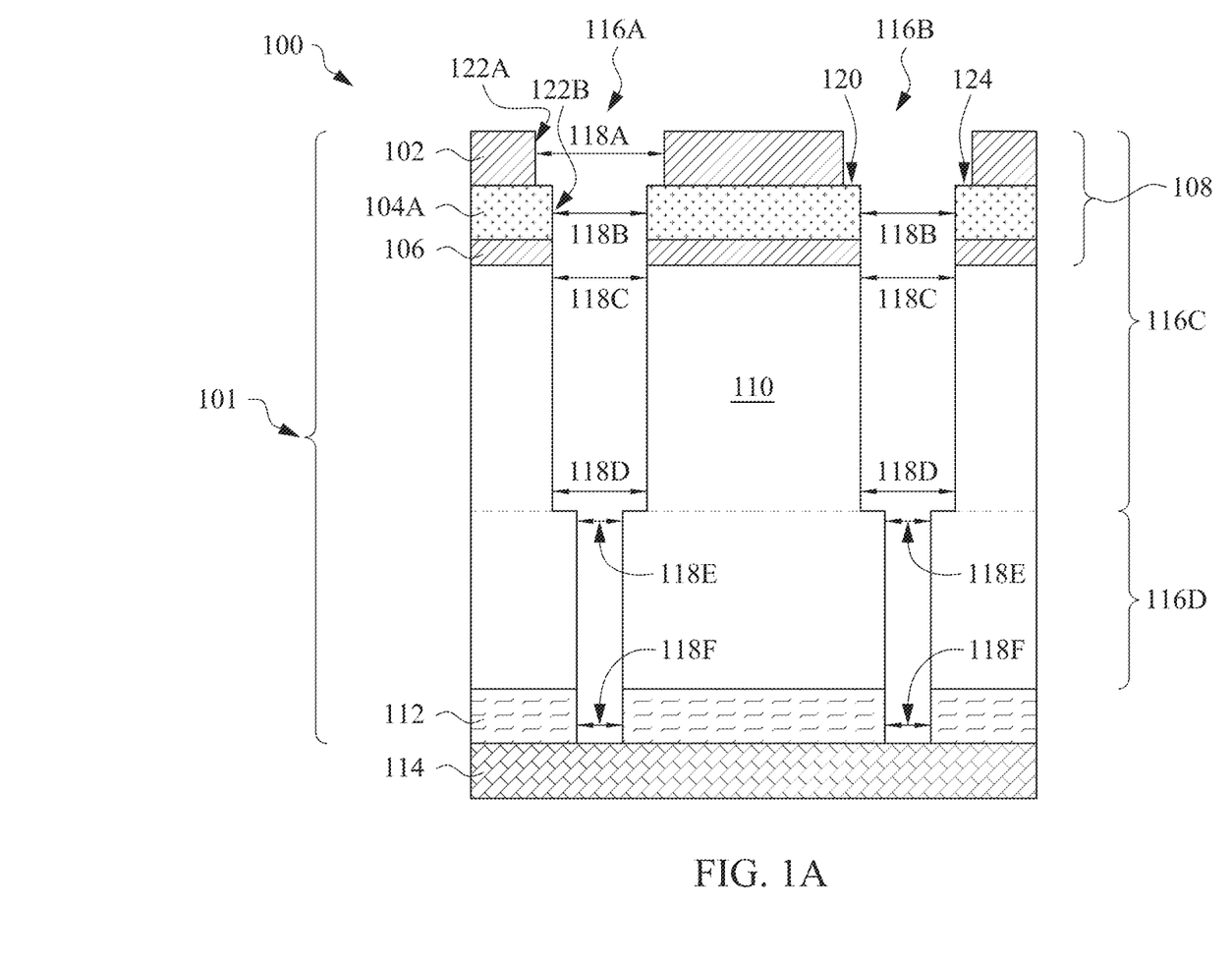
FIGS. 1A-1B are cross-sectional diagrams of a semiconductor device during a manufacturing process, in accordance with some embodiments.

FIG. 1 is a cross-sectional diagram of a semiconductor device 100 during a manufacturing process, in accordance with some embodiments. FIG. 5 is a flow diagram of a method 500 of making a copper interconnect, in accordance with some embodiments. Operations of the method 500 are described below, and the description makes reference to elements of the dual damascene trench structures and copper interconnect structures of FIGS. 1-4, as being representative of embodiments of the present disclosure, throughout.

Semiconductor device 100 includes dual damascene structure 101 above a base conductive layer 114. An etch stop layer 112 is over the base conductive layer 114, and a dielectric layer 110 is over etch stop layer 112. Base conductive layer 114 is, in some embodiments, a contact. In some embodiments, base conductive layer 114 is a metal line. In some instances, base conductive layer 114 is a dual damascene-style interconnect in a lower level of an integrated circuit. Thus, a base conductive layer stack is formed by either sputtering or electroplating, in order to accommodate the profile of the opening being filled and an integration scheme used in manufacturing the integrated circuit. In some embodiments, a base conductive layer is a contact in a lower level of a semiconductor device. In some embodiments, a base conductive layer is a metal line on a lower level of a semiconductor device. In some embodiments, a base conductive layer is a dual damascene structure in a different level of a semiconductor device.

Etch stop layer 112 includes one or more layers of a dielectric material with a lower etch selectivity to an etch process than dielectric layer 110, under the etch conditions with which interconnect openings are formed in the dielectric layer. In some instances, etch stop layers are made of one or more layers of silicon nitride or silicon oxy-nitride deposited onto a lower dielectric layer and directly beneath dielectric layer 110.

Dielectric layer 110 is an interlayer dielectric (ILD) deposited over etch stop layer 112. Dielectric layer 110 is etched to form openings for interconnect structures to be formed therein. Interconnect structures include dual damascene interconnect structures, having a via region and a bar/trench region. Dual damascene structure 101 has a trench opening in an upper region 116C and two or more via openings in a lower region 116D. According to some embodiments, the thickness of the upper region 116C and the thickness of the lower region 116D are approximately the same thickness. In some embodiments, the thicknesses of the upper region 116C and the lower region 116D are different thicknesses. In some embodiments, the thickness of the upper region 116C is smaller than the thickness of the lower region 116D.

Dielectric layer 110 includes silicon dioxide, spin on glass, boron-phosphorus spin on glass (BPSG), fluorinated silica glass (FSG), or an organic low-k dielectric material containing, for example, silicon, oxygen, carbon, and hydrogen. A non-limiting example of an integrated circuit having an organic low-k dielectric material includes low-k dielectric materials such as BLACK DIAMOND®, porous silicon, or the like. A material used for dielectric layer 110 depends on the spacing between and width of adjoining lines (or, trenches) in the dielectric layer. Silicon dioxide is one example of a dielectric material which is deposited onto a contact etch stop layer (CESL) by chemical vapor deposition (CVD). Techniques of chemical vapor deposition include plasma enhanced chemical vapor deposition (PE-CVD), high-pressure chemical vapor deposition (HP-CVD), and so forth. BPSG, FSG, and various low-k dielectric materials are deposited onto a contact etch stop layer by various methods, including deposition of a liquid matrix followed by spinning a wafer to remove excess material, leaving behind a thin film of dielectric material on the substrate. Some examples of low-k dielectric materials are deposited onto a contact etch stop layer or other substrate by techniques similar to PE-CVD, where dielectric material is the result of a chemical reaction occurring in a plasma above the substrate where deposition occurs.

In some embodiments, dielectric layer 110 is a single film deposited in one process. In some embodiments, dielectric layer 110 includes a plurality of dielectric materials deposited over etch stop layer 112. Antireflective layer 106 of metal hardmask 108 is over dielectric layer 110. In some embodiments, antireflective layer 106 is directly against top surface of dielectric layer 110. Dual damascene structure 101 includes two openings 116A and 116B extending through metal hardmask 108, dielectric layer 110, and etch stop layer 112 to expose a top surface of base conductive layer 114.

Method 500 includes an operation 505, wherein a metal hardmask, such as metal hardmask 108, is deposited over a dielectric layer 110. Metal hardmask 108 includes antireflective layer 102, a metallic layer 104A (e.g., a metal nitride layer), and antireflective layer 106. In some embodiments, a metal hardmask includes a single antireflective layer and a metallic layer, rather than two antireflective layers and a metallic layer. When two antireflective layers are present in a metal hardmask, a first antireflective layer is above the metallic layer, and the second antireflective layer is below the metallic layer. In dual damascene structure 101, the antireflective layers 102 and 106, above and below the metallic layer 104A, are situated to improve photolithography of the metallic layer. Improved photolithography includes increased uniformity in the width of an opening, improved straightness of opening edges, and more vertical opening sidewalls. In some embodiments, a single antireflective layer is present above the metallic layer. In some embodiments, the single antireflective layer is present below the metallic layer. Antireflective layers adjust a photolithography process to achieve uniform line shape and profile of the sidewall of either the metallic layer or the underlying dielectric layer.

The number of antireflective layers included in the metal hardmask is a function of difficulties associated with forming openings through the metal hardmask and in the underlying dielectric layer. For some combinations of dielectric layer and metal hardmask, a single antireflective layer beneath metallic layer suffices to preserve uniform sidewall profile and line shape of the openings. When a sidewall of an opening through a nitride layer or in a dielectric layer has lateral oscillations, or a wavy shape, a second antireflective layer is included to improve the shape of the opening through both the metallic layer and into the dielectric layer.

According to some embodiments, the metallic layer 104A is a titanium nitride layer, although nitrides of other metals are also envisioned within the scope of the present disclosure. Other metals that are used to make a nitride layer of a hardmask include, but are not limited to, titanium, zirconium, tantalum, niobium, vanadium, tungsten, chromium, cobalt, nickel, silicon, and zinc.

Metallic layer 104A has a thickness ranging from about 10 nm to about 100 nm. Thicknesses of metallic layers that are greater than 100 nm add to the cost of manufacturing an integrated circuit, without producing an additional benefit in terms of improved line smoothness of trenches or vias of dual damascene structures. Metallic layers that are less than 10 nm thick do not resist etching processes for long enough to sufficiently reduce or prevent unanticipated line roughness of trenches or vias of dual damascene structures. Further, metallic layers that are less than 10 nm thick exhibit thickness variation that impacts the etch time to punch through the metal hardmask layers without modifying the depth of an etch into an underlying dielectric layer. When the metal hardmask etch process punches through the metal hardmask and into the dielectric layer, the depth of the trench portions of the interconnect opening is not uniform across a die, leading to deviations of interconnect structure resistance from a circuit specification throughout the circuit.

Antireflective layer 102 is deposited over dielectric layer 110, or on top of metallic layer 104A, in order to create more uniform structures developed by photolithographic techniques. Antireflective layers reduce and/or eliminate swing curves, standing waves in photoresist, and linewidth variation of a patterned line. Antireflective layers such as antireflective layers 102, 106 help to produce interconnects with resistance and other electrical properties that satisfy a design specification of the integrated circuit. Deviations of interconnect structure electrical properties from the design specification adversely affect the integrated circuit. Such deviations include increased resistance, slower switching time, parasitic capacitance, and electromigration. Antireflective layers 102, 106 independently have a thickness ranging from about 10 to about 100 nm. When an antireflective layer is thinner than about 10 nm, the antireflective layer does not provide sufficient protection, during an integrated circuit manufacturing process, from photolithographic defects described above. When an antireflective layer is thicker than about 100 nm, the antireflective layer does not provide additional benefit, consumes a greater amount of material and increases the complexity of manufacturing the integrated circuit. The increased complexity of manufacturing an integrated circuit is associated with processes of developing photoresist, removing photoresist, removing the antireflective layer, and cleaning residual particles from surfaces during the manufacturing process. In some embodiments, the antireflective layer is a BARC layer, a Topside ARC layer, or a DARC layer. In some instances, the anti-reflective layer is free of nitrogen.

Method 500 includes an operation 510, wherein an opening is etched in the metal hardmask. An opening in a hardmask is formed by depositing a layer of patterning material, such as photoresist, on a top surface of the metal hardmask, forming a pattern within the layer of patterning material, such as by photolithography or electron beam lithography, and removing a portion of the pattern to expose a top layer of the metal hardmask. Etching an opening in a metal hardmask includes one or more plasma etch steps in order to remove portions of the hardmask exposed within openings of the overlaying patterning layer. Chemistry, pressure, and power settings of plasma etch steps to remove portions of the metal hardmask are adjusted based on the materials of the metal hardmask and the size of the opening in the overlaying patterning layer.

Method 500 also includes an operation 515, in which at least one interconnect opening is formed below a metal hardmask. An interconnect opening extends through both the layers of a metal hardmask, a dielectric layer, and a CESL in a semiconductor film stack, according to some embodiments. Interconnect openings are formed in multiple steps. One step of an operation where an interconnect opening is formed includes at least one etch process to form one or more openings in a metal hardmask layer such as metal hardmask 108. In some embodiments, one step of an operation for forming interconnect openings includes forming a trench in an upper portion of a dielectric layer, followed by forming a via extending through a lower portion of the dielectric layer. In some instances, the via is formed first, followed by the trench portion of the interconnect opening. For purposes of the present discussion, descriptions of operations for forming an interconnect opening will include a trench-first scheme, as described herein below, although a via-first scheme is also envisioned by the present disclosure. In some embodiments, one step of an operation for forming interconnect openings also includes forming openings in a CESL below the dielectric layer, to expose a conductive base layer.

In a trench-first scheme for making interconnect openings, an opening 116A, 116B in the metal hardmask 108 corresponds to an outline of a trench to be formed in an upper region 116C of the dielectric layer 110. In dual damascene structure 101, upper region 116C includes both an opening in an upper part of the dielectric layer 110, and the opening in the metal hardmask 108.

Once a trench has been formed in upper region 116C, any residual patterning material left on a top surface of metal hardmask 108 is removed and a second layer of patterning material is deposited on a top surface of the metal hardmask 108, and within the trench openings in upper region 116C. During a second patterning step, portions of the second patterning material are removed, either from the top surface of metal hardmask 108, or from areas within the upper region 116C, to form a second pattern on a die surface for etching vias. After the pattern in the second patterning material is formed, a second etch process is undertaken to form vias in a lower region 116D. Lower region 116D, as shown in dual damascene structure 101, includes a lower portion of dielectric layer 110, and etch stop layer 112. Subsequent to the etch process used to form vias in the lower region 116D, the second patterning material is removed from the die surface.

Dual damascene structure 101 is an unfilled structure, where two openings 116A and 116B extend through the metal hardmask 108 to expose some of the base conductive layer 114. Openings 116A and 116B of dual damascene structure 101 have different diameters at locations above base conductive layer 114. Moving downward from the top surface of the metal hardmask, openings 116A and 116B have a first width 118A at a level of antireflective layer 102, a second width 118B at a level of the metallic layer 104A, a third width 118C at an interface of dielectric layer 110 and antireflective layer 106, a fourth width 118D at a bottom of the trench region 116C of openings 116A and 116B, a fifth width 118E at a top of the via region 116D of openings 116A and 116B, and a sixth width 118F at a bottom of the via region 116D. Again, moving downward, first width 118A is larger than second width 118B, second width 118B is larger than third width 118C, third width 118C is larger than fourth width 118D, fourth width 118D is larger than fifth width 118E, and fifth width 118E is larger than sixth width 118F.

A sidewall 122A of antireflective layer 102 does not vertically align with the sidewall 122B of metallic layer 104A, as indicated by the different widths 118A and 118B of opening 116A. Thus, at an interface 120 between antireflective layer 102 and metallic layer 104A, a step or "kink" is situated such that a top surface 124 of metallic layer 104A is exposed within the opening of the dual damascene structure. When a top surface 124 of metallic layer 104A is exposed, deposition of a seed layer of conductive material into a dual-damascene structure opening proceeds more rapidly at the location of the step at the exposed top surface 124. Thus, during deposition of the seed layer, the seed layer grows non-uniformly. The location of fastest seed layer growth occurs at the location of the exposed top surface 124, such that the opening of a dual-damascene structure has a smaller diameter than lower portions of the dual damascene structure after seed layer deposition. In the present disclosure, a method 500 describes a process of forming an interconnect structure without the above-mentioned non-uniform seed layer deposition.

Method 500 includes an operation 520, in which a portion of a metal hardmask is modified to produce a sloped sidewall, according to some embodiments. In operation 520, the metal hardmask is modified by processing the metal hardmask to diffuse non-metal atoms into the metallic layer (or, in some embodiments, a metal layer) in order to produce a stack of material with different lattice constants at different positions in the stack of material. As a lattice constant of a material changes, the size of the material changes as well. In the present disclosure, addition of a non-metal atom to a metal layer, or to a metallic layer, increases the lattice constant and corresponds to the metallic layer swelling or expanding upon incorporation of the non-metal atoms.

Processing the metal hardmask includes an annealing process and/or a plasma process to heat the metal hardmask. Plasma processing also includes generation of ionized atoms above a surface of the semiconductor device during the process that penetrate into one or more layers of the metal hardmask to modify the composition and the shape of the metal hardmask. The new layer, or poisoned layer, includes components of both the metallic layer and the antireflective layer and has a sloped sidewall which replaces the step, or exposed top surface 124 of the metallic layer 104A, as described above. Poisoning of a layer or material refers to the modification of a layer by diffusion of atoms from an adjoining layer into the poisoned layer.

Figure 1B:
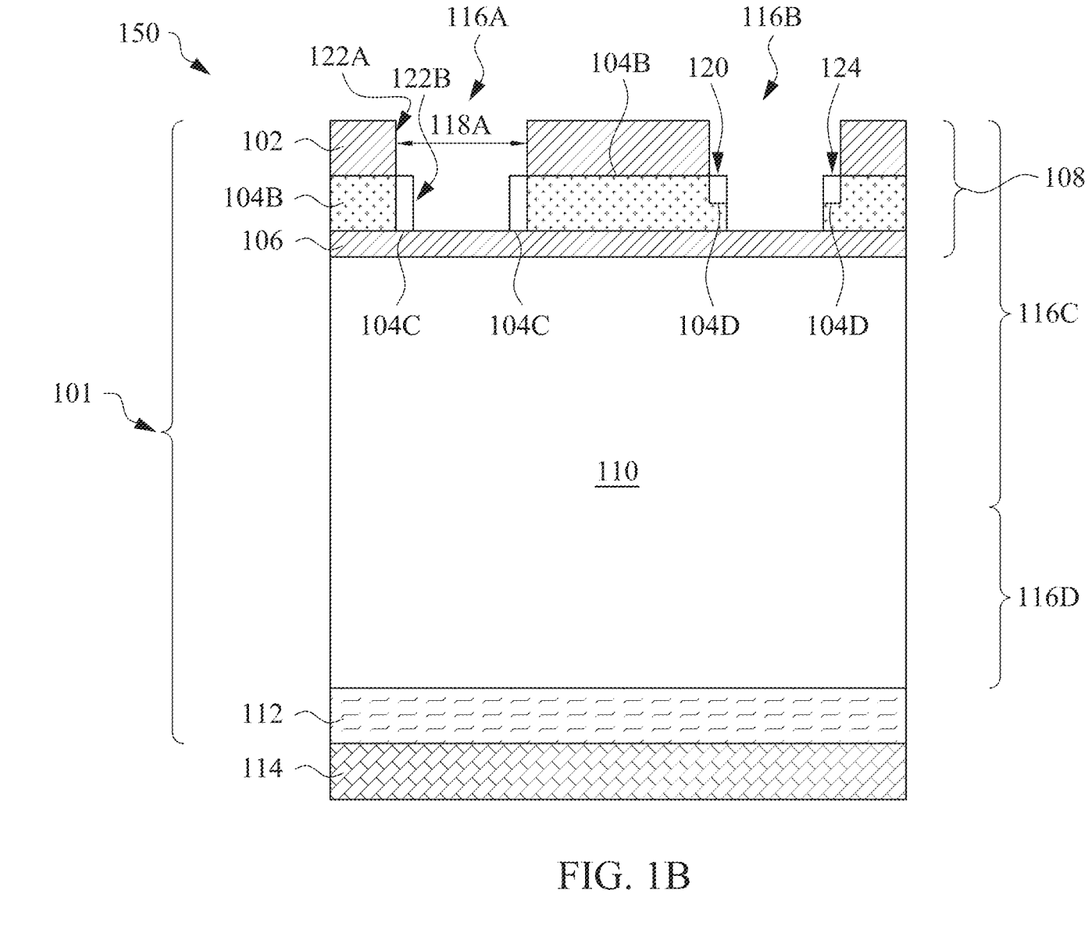

FIG. 1B is a cross-sectional diagram of a semiconductor device 150 during a manufacturing process, in accordance with some embodiments. Elements of FIG. 1B which correspond to elements of FIG. 1A have a same reference numeral. A person of ordinary skill will understand that the disclosure relates to additional embodiments than those shown herein, and that there the features described herein are used for convenience to describe the scope of the present disclosure and methods of making semiconductor devices.

In FIG. 1B, metal hardmask 108 includes a metallic layer 104B with a non-metal atom-treated surface 104C. According to some embodiments, the metallic layer 104B is deposited over dielectric layer 110 and subsequently treated with non-metal atom to modify the interface 120 between the metallic layer 104B and one or more antireflective layers 102, 106, such that part of the metallic layer 104B is converted to a non-metal atom-enriched metal region 104C. In some embodiments, the process of adding non-metal atoms to a layer, e.g., metallic layer 104B, is known as poisoning the layer. In some embodiments, metallic layer 104B is enriched with non-metal atoms by exposing the sidewalls 122B of the metallic layer 104B to a plasma of dissociated non-metal atoms in the absence of oxygen, such that the atoms generated in the plasma are accelerated toward the exposed surface of the metallic layer 104B, and penetrate into the metallic layer 104B. In some embodiments, the non-metal atoms are nitrogen atoms. In some embodiments, the non-metal atoms are a mixture of nitrogen and oxygen. For the discussion below, the non-metal atom discussed is nitrogen, although other atoms are envisioned in the present disclosure.

Addition of nitrogen to the metallic layer 104B modifies the chemical composition of the metallic layer 104B layer and modifies the lattice constant of the material. According to an embodiment, a lattice constant of a material determines an amount of strain in the material, as the material transitions between layers of other material above and below the material with the modified lattice. In some embodiments, adding material to modify the lattice constant of a material causes the material to swell or increase in size, because the lattice constant is larger, after the modification (*e.g., adding nitrogen to a metallic layer) than before the modification. In some embodiments, the addition of a non-metal atom to a metallic layer shrinks the lattice constant, causing the material to contract. In some embodiments, as shown in FIG. 1B, the metallic layer 104B is "poisoned" by addition of nitrogen from nitrogen-rich plasma before antireflective layer 106 is opened to expose dielectric layer 110. In some embodiments, the metallic layer 104B is "poisoned" by addition of nitrogen from nitrogen-rich plasma after antireflective layer 106 has been opened and dielectric layer 110 is exposed to the plasma. Exposing the dielectric layer 110 to nitrogen-rich plasma modifies the exposed portion of the dielectric layer 110 in addition to the exposed sidewall of the metallic layer 104B. Poisoning the metallic layer 104B before opening the antireflective layer 106, as shown in FIG. 1B, preserves the chemical composition and physical structure of dielectric layer 110 from modification, making an etch process to form the interconnect opening (see 116A and 116B) more uniform, and faster than if the dielectric layer 110 is enriched in nitrogen.

Nitrogen-enriched region 104C covers an entirety of the exposed top portion and sidewall of metallic layer 104B material in opening 116A. Nitrogen-enriched region 104D covers the exposed top portion, and an upper portion of the sidewall, of metallic layer 104B material in opening 116B. The degree of coverage of the nitrogen-enriched region on sidewall of metallic layer 104B is a function of the plasma characteristics (e.g., the ion acceleration characteristics) of the plasma used to generate the dissociated nitrogen atoms. As the etch plasma becomes more anisotropic, the degree of sidewall coverage increases.

Figure 2:
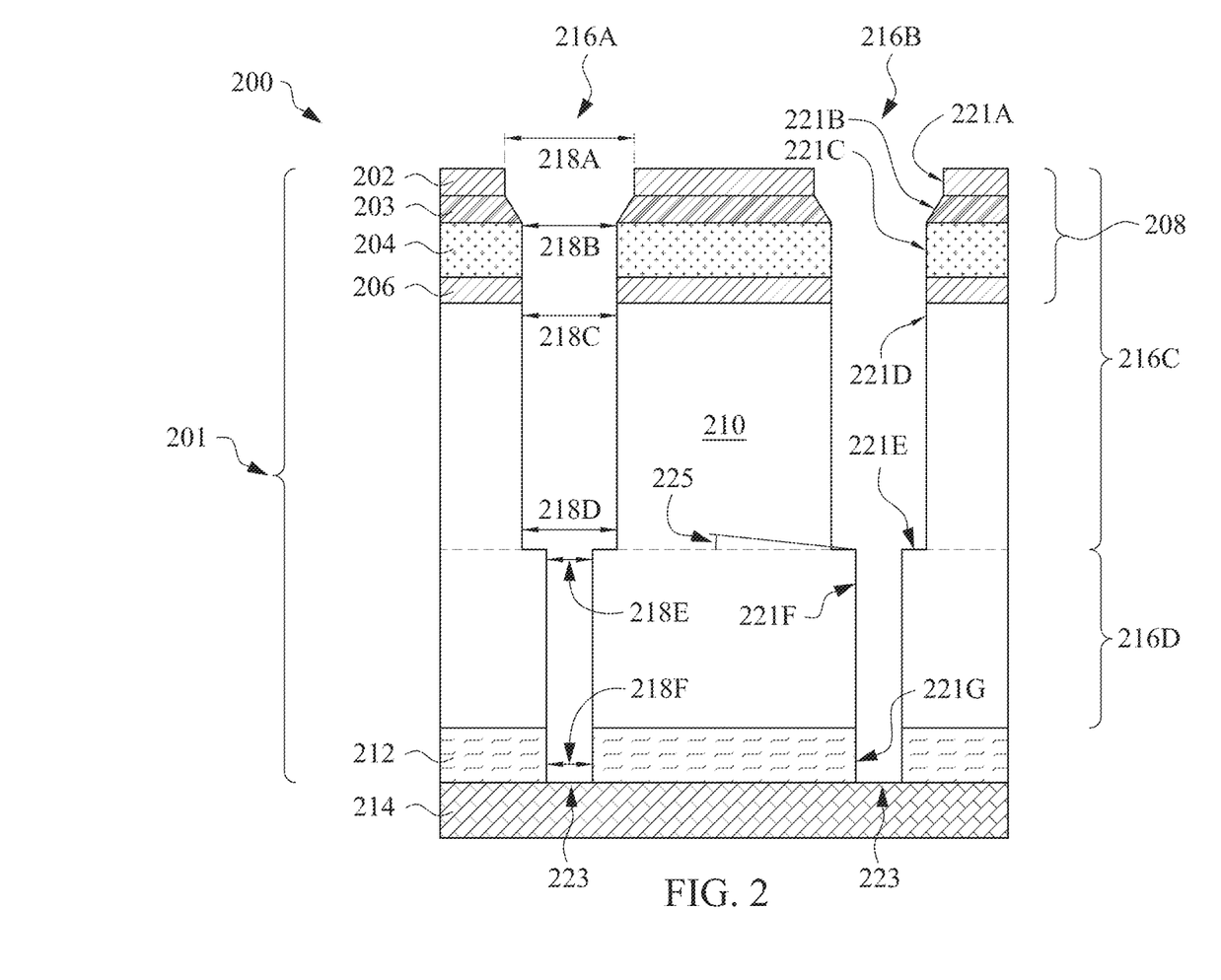
FIG. 2 is a cross-sectional diagram of a semiconductor device with a sloped sidewall profile during a manufacturing process, in accordance with some embodiments.

FIG. 2 is a cross-sectional diagram of a semiconductor device 200 with a sloped sidewall profile during a manufacturing process, in accordance with some embodiments. Elements of FIG. 2 that are similar to elements of FIG. 1, described above, have a same reference numeral, incremented by 100. In FIG. 2, a sidewall of the metal hardmask 208 is modified by heating the antireflective layer 202 and metallic layer 204 to cause compounds from the antireflective layer 202 and metallic layer 204 to bleed into each other. Thus, antireflective layer 202 and metallic layer 204, which are directly against each other in FIG. 1, are separated from each other in FIG. 2 by poisoned layer 203. Antireflective layer 202 has a sidewall 221A that is approximately vertical. Metallic layer 204 has a sidewall 221C that is approximately vertical. Poisoned layer 203 has a poisoned layer sidewall 221B that is not vertical, but sloped, bridging the space between sidewall 221A and sidewall 221C, which are laterally separated from each other. Sidewall 221C has a slope approximately the same as a slope of sidewall 221D of the trench region in dielectric 210. In some embodiments, the slope of sidewall 221C is different from the slope of sidewall 221D. Sidewall 221F is an upper portion of the sidewall of the via region of the interconnect structure openings 216A/216B, and sidewall 221G is a sidewall of a lower portion of the via region of the interconnect structures. Exposed surface 223 of base connector layer 214 is at a bottom of interconnect structures 216A and 216B. Sidewall 221E is located between sidewall 221D and 221F. In some embodiments, angle 225 ranges from 10 to 70 degrees, although other angles are also contemplated within the scope of the present disclosure. According to theory and belief, interconnect structures having angle 225 smaller than 20° are prone to formation of voids in the metal fill of the interconnect structure. In some embodiments, seed layer deposition becomes sporadic or uneven in a lower part of interconnect structure (e.g., along portions of sidewall 221F) for values of angle smaller than 20°. Metal fill of the interconnect structure is prone to void formation in embodiments of an interconnect structure wherein angle 225 is smaller than 20° because of uneven accumulation of material at the corner between sidewall 221E and sidewall 221F.

In some embodiments, modifying the metal hardmask sidewall, or poisoning a layer of the metal hardmask, includes one or more steps related to annealing and/or processing the metal hardmask in a plasma. When metal hardmask poisoning occurs by annealing, the annealing step includes one or more of rapid thermal processing (RTP), pulsed laser annealing, or other rapid annealing processes that contribute to inter-layer diffusion of atoms without causing melting of one or more layers of the metal hardmask. Annealing or rapid thermal processing of metal hardmask layers involves heating the metal hardmask to temperatures ranging from 600° Celsius to 900° C. for periods up to 60 seconds. In some embodiments, elevated temperatures ranging from 600° C. to 700° C. are maintained for periods ranging from 40 to 60 seconds. In some embodiments, elevated temperatures ranging from 700° C. to 800° C. are maintained for periods ranging from 20 to 40 seconds. In some embodiments, elevated temperatures ranging from 800° C. to 900° C. are maintained for periods ranging from 10 to 20 seconds. In some embodiments, elevated temperatures ranging from 900° C. to 1000° C. are maintained for periods ranging from 1 to 10 seconds. In some embodiments, thermal processing is performed at temperatures over 1000° C. with exposure times of less than one second at peak temperatures are employed in order to promote diffusion of atoms without melting of metal hardmask layers. In some instances, peak temperatures of laser annealing processes achieve greater than 1300°, with exposure times on the order of milliseconds or microseconds.

In some embodiments, modifying metal hardmask sidewall includes exposing the metal hardmask, after the interconnect opening is formed, to a nitrogen-containing plasma. The nitrogen-containing plasma generates nitrogen ions in the plasma that contaminate exposed antireflective layer coatings or sidewalls and heat the metal hardmask to promote metal diffusion out of the metallic layer and into one or more of the antireflective layers present in the metal hardmask. During exposure of the metal hardmask to nitrogen-containing plasma, little or no etching takes place. Rather, nitrogen in the plasma is ionized and nitrogen ions react with exposed portions of the antireflective layers. Reflective layers, typically being organic layers, are susceptible to nitrogen uptake from plasma or adjoining materials in a film stack.

Modification of the metal hardmask to form a poisoned layer in the metal hardmask includes forming a poisoned layer having a thickness ranging from about 0.1 nm to about 10 nm. Poisoned layers less than 0.1 nm do not have sufficient vertical thickness to bridge the lateral gap between the sidewall of the antireflective layer and the metallic layer in a metal hardmask. Poisoned layers greater than 10 nm in thickness are associated with increased risks in melting the metal hardmask layers, making partial or complete removal of metal hardmask more difficult after the conductive material is deposited in an interconnect opening. Poisoned layers (or, poisoned metal layers) have a compositional ratio of metal to non-metal atoms of between 0.25:1 to 1:1. When a metal compositional ratio is smaller than 0.25:1, the sidewall of the poisoned metal layer does not have a slope that avoids excessive collection of seed layer material. When a metal compositional ratio is greater than 1:1, the sidewall of the poisoned metal layer has a slope that avoids excessive collection of seed layer material, but the greater thickness of the poisoned metal layer does not promote reduction in seed layer uniformity. Poisoned metal layers with a compositional ratio of less than 0.25:1 do not exhibit sufficient mixing of the metallic and antireflective layer to achieve a sloped sidewall compatible with void-free bulk conductive material electroplating.

The metal compounds in the metallic layer 104A have a chemical formula of $A_xB_y$ where A is the metal and B is the non-metal atom. Metal compounds (metallic layers) of the metal hardmask have a compositional ratio (x:y) of metal to nonmetal atoms of between 1:1 to 1:3. When a nitrogen compositional ratio of the metallic layer is less than 1:1, there is insufficient nitrogen in the metallic layer to form a poisoned metal layer that exhibits reduced seed layer material collection. When a nitrogen compositional ratio of the metallic layer is greater than 1:3, the metallic layer has insufficient metal to form a poisoned metal layer with an antireflective layer. In some embodiments, the metal A is titanium (Ti), and the non-metal atom is nitrogen (N). In some embodiments, the metal atom A is titanium and the non-metal is a mixture of nitrogen and oxygen (O), such that $A_xB_y$ is $Ti_xN_yO_z$. In some embodiments, other combinations of metal and non-metal are used according to semiconductor manufacturing processes known to those skilled in the art.

Method 500 includes an operation 525, wherein a conductive material is deposited into the at least one opening in the dielectric layer. In manufacturing dual-damascene structures in integrated circuits, conductive material is deposited in several steps. In one step of operation 525, a seed layer of conductive material is sputtered onto a top surface of the metal hardmask 208 and onto sidewalls 221A-221G of interconnect structures. Another step of operation 525 includes electroplating of a conductive material into interconnect openings (the at least one opening in the dielectric layer). The seed layer (not shown in FIG. 2; see FIG. 3) acts as one electrode for the electroplating process to proceed. Because poisoned layer 203 has a sloped sidewall 221B, electroplating of conductive material into the interconnect opening occurs with less likelihood of forming a void or pocket within the interconnect because there is no junction at a level of the interconnect opening corresponding to a level of the poisoned layer 203.

According to some embodiments, the seed layer (not shown in FIG. 2; see FIG. 3) and the electroplated bulk conductive material are a same material. In some instances, the seed layer and bulk electroplated conductive material are different materials. Conductive materials used in formation of dual damascene interconnect structures include a copper and copper alloys. Copper alloys include copper admixed with aluminum, zinc, and other metals to promote uniform electrodeposition of material within an interconnect opening and to reduce grain size of the electroplated conductive material. In some embodiments subsequent to operation 525, one or more layers over the dielectric layer are removed by, e.g., chemical mechanical polishing (CMP) in order to prepare an integrated circuit for deposition of another dielectric material such as a contact etch stop layer (for, e.g., a dual damascene structure) or a dielectric layer in which a conductive line is to be manufactured.

Figure 3:
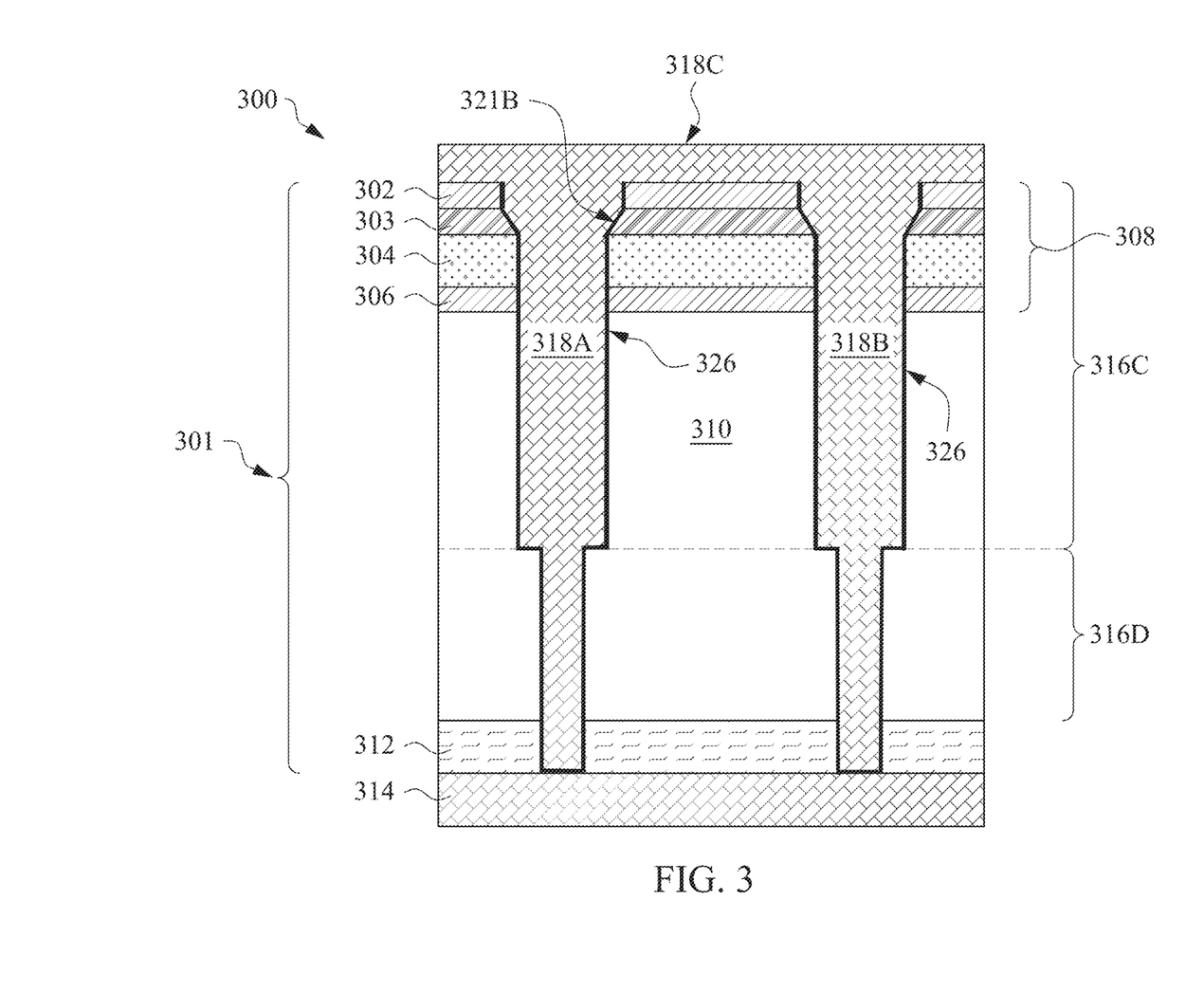
FIG. 3 is a cross-sectional diagram of a semiconductor device with a copper interconnect during a manufacturing process, in accordance with some embodiments.

FIG. 3 is a cross-sectional diagram of a semiconductor device 300 with a copper interconnect structure 301, in accordance with some embodiments. Elements of FIG. 3 that resemble elements of FIG. 2, above, have a same reference numeral, incremented by 100. In interconnect structure 301, conductive material covers the sides of the dual damascene structure openings, as well as the top of the metal hardmask 308. Thus, interconnect structures 318A and 318B are electrically connected by planar conductive material 318C. Interconnect structures 318A and 316B have a line region 316C and a via region 316D. The via region 316D of each interconnect structure is electrically connected to base conductor 314.

Because poisoned layer 303 has a sloped sidewall 321B, deposition of a seed layer 326 of conductive material (copper or a copper alloy) onto sidewalls of the interconnect opening does not produce a constriction point at a top of the interconnect opening. By eliminating formation of a constriction at a top of the interconnect opening, interconnect structures 318A and 318B do not have voids or hollows located therein. In some embodiments, seed layer 326 is deposited into the interconnect opening (see elements 216A, 216B of FIG. 2) soon after etching through the dielectric material to prevent oxidation of an exposed metal of base conductor 314 (e.g., a metal-filled via or trench in a lower level of the semiconductor device). By depositing the seed layer soon after exposing the metal of base conductor 314, there is a reduction in the formation of metal oxides on the base conductor 314, which reduces resistance at the interface at the bottom of the interconnect after metal fill has occurred. In some embodiments, the seed layer covers an inner sidewall of the antireflective layer 302, the poisoned layer 303, the metallic layer 304, and the antireflective layer 306. In some embodiments, the poisoned layer 303 is an interior sidewall (see element 104C of FIG. 1B) of the metallic layer 304. In some embodiments, the poisoned layer is a top portion (see element 104D of FIG. 1B) of the exposed metallic layer 304 material.

Figure 4:
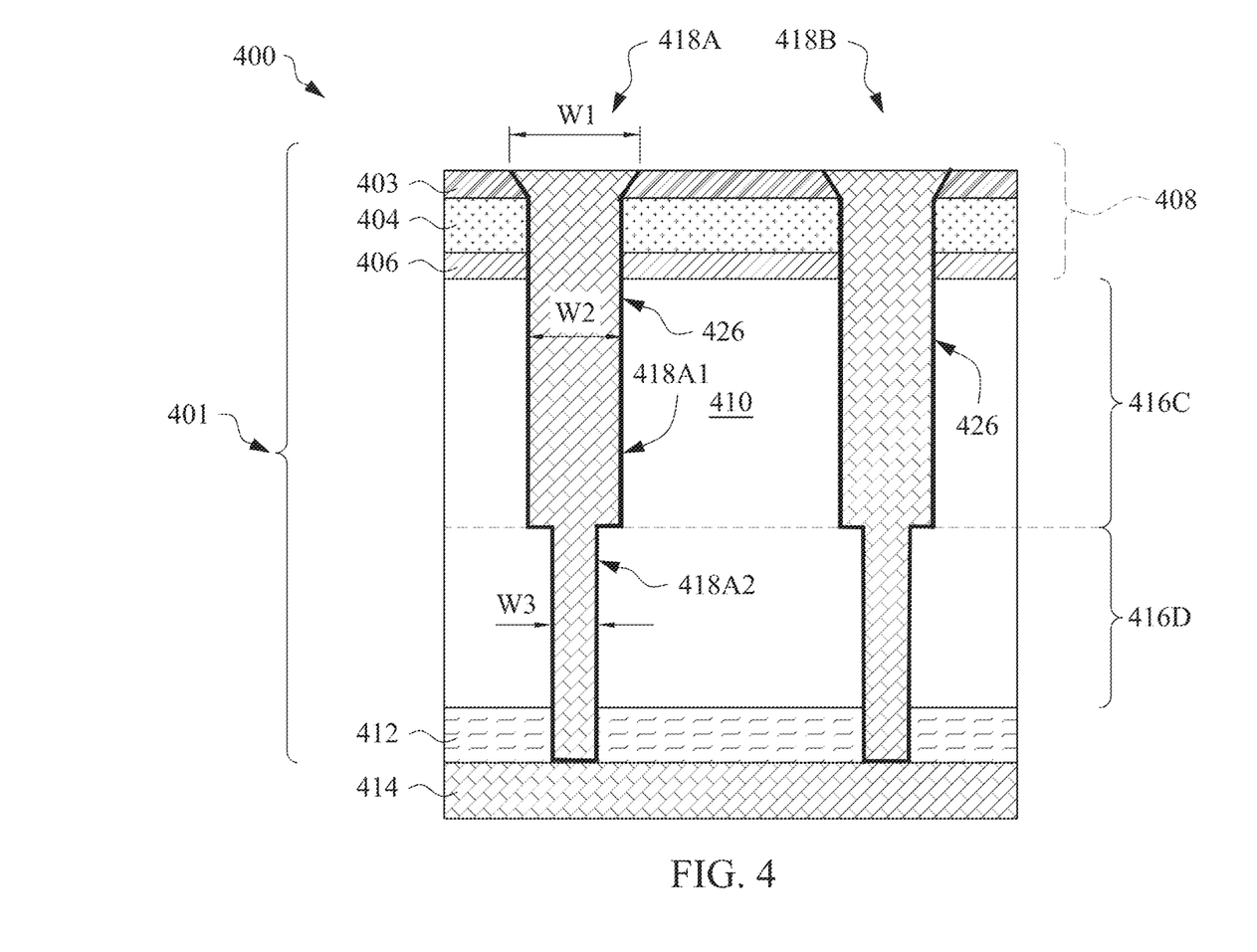
FIG. 4 is a cross-sectional diagram of a semiconductor device with a copper interconnect during a manufacturing process, in accordance with some embodiments.
Figure 5:
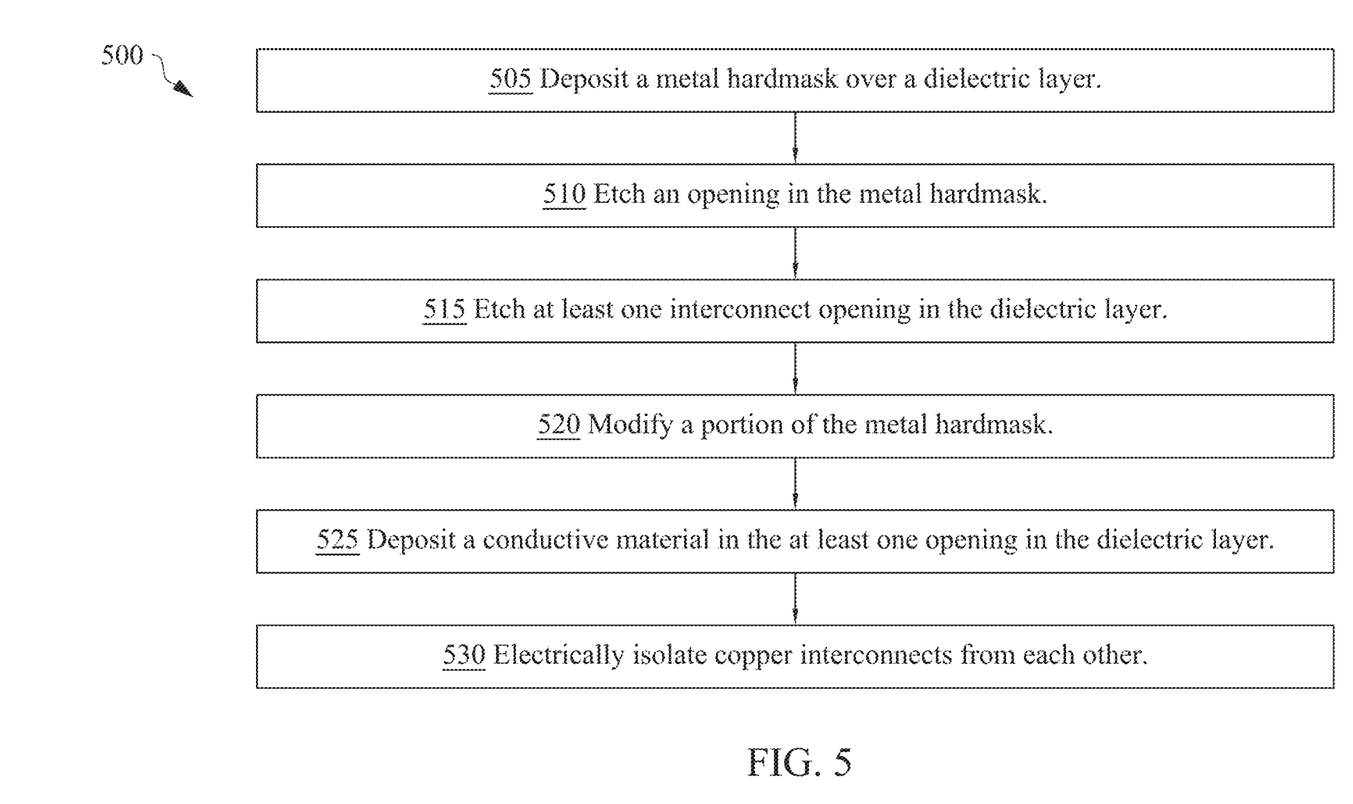
FIG. 5 is a flow diagram of a method of making a copper interconnect, in accordance with some embodiments.

FIG. 4 is a cross-sectional diagram of a semiconductor device 400 with a copper interconnect structure 401, in accordance with some embodiments. Method 500 includes an operation 530 in which copper interconnects formed in operation 530 are electrically isolated from each other. Electrical isolation of copper interconnect structures occurs by chemical mechanical polishing (CMP) processes performed on a top surface of a die or semiconductor wafer. Electrical isolation of copper interconnects is deemed complete when the materials positioned laterally between interconnects (see interconnect 418A and 418B of FIG. 4) are significantly less.

In FIG. 4, elements similar to structures described previously in FIG. 1 share a same reference numeral, incremented by 300. Interconnect 418A and interconnect 418B extend through metal hardmask 408, dielectric material 410, and etch stop layer 412 to make electrical connection with base conductive layer 414. Interconnect 418A has an upper portion 418A1 with a first width W1 at a top of the upper portion 418A1. The first width W1 corresponds to the top most portion of the upper portion 418A1 at a same vertical distance from the dielectric material 410 as the poisoned layer 403. The first width W1 is greater than the width of the remainder of the upper portion 418A1. A bar region 416C of a dual damascene interconnect structures 418A and 418B is formed in the trench portion of interconnect structure opening 216A/216B. A via region 416D of interconnect structures 418A and 418B extends through a lower region of dielectric layer 410. Metal hardmask 408, shown in FIG. 4, is optionally removed from a top surface of dielectric layer 410, according to the material of the metallic layer. In some embodiments, metal hardmask 408 includes a silicon nitride layer, and the metal hardmask remains after bulk conductive material, such as electroplated copper, is removed from a top surface of the metal hardmask, isolating the dual damascene interconnect structures from each other. A silicon nitride layer does not have sufficiently high conductivity to allow current flow between interconnect structures. A metallic layer that includes, e.g., titanium nitride, has sufficient electrical conductivity that the metallic layer is removed to prevent leakage current between interconnect structures. Metallic layers are removed from a top surface of dielectric layer 410 by, e.g., chemical mechanical polishing (CMP).

Figure 6:
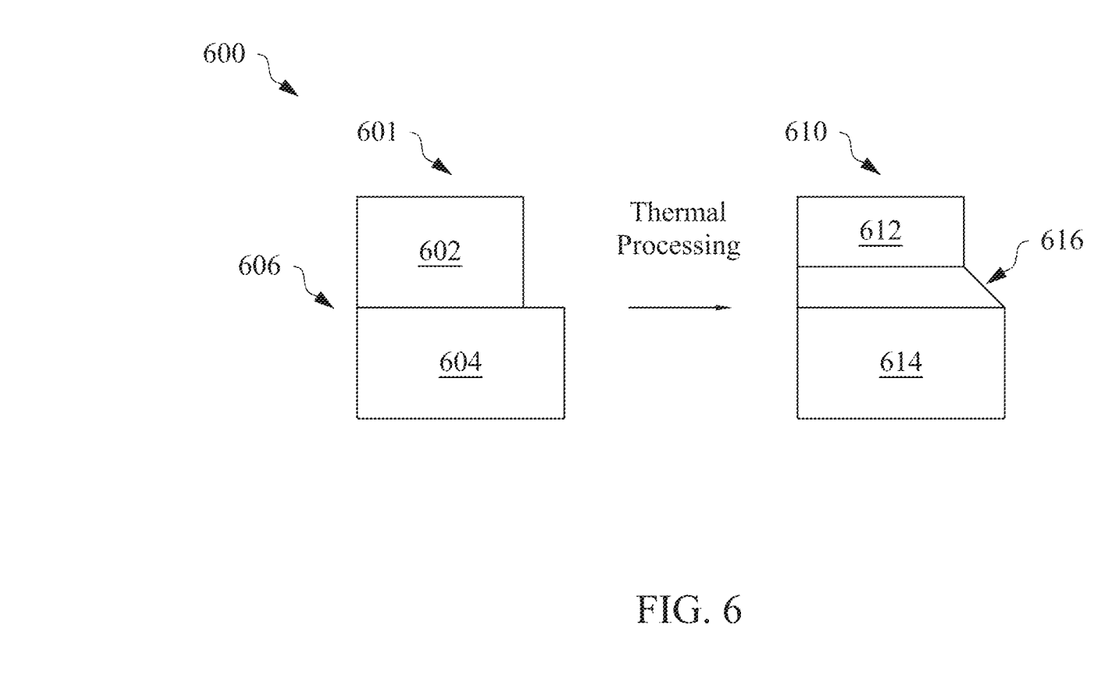
FIG. 6 is a cross-sectional diagram of layers of an integrated circuit during a manufacturing process, in accordance with some embodiments.

FIG. 6 is a cross-sectional diagram of layers of an integrated circuit 600 during a manufacturing process, in accordance with some embodiments. The present disclosure is directed to integrated circuits formed through a method of smoothing a sidewall of an integrated circuit interconnect opening before filling the interconnect opening with metal to make an interconnect structure (e.g., a trench and via in a dual damascene structure of a layer of an integrated circuit). Integrated circuit 600 has an interface 606 between a first layer 602 and a second layer 604. In some embodiments, the first layer 602 is a metallic layer and the second layer 604 is an antireflective layer. In some embodiments, the first layer 602 is an antireflective layer and the second layer 604 is a metallic layer. A metallic layer is a layer of, e.g., metal nitride or a metallic oxy-nitride layer. In structure 601, the first layer 602 and the second layer 604 are depicted before thermal processing to smooth the sidewall. Structure 610 describes a first layer 612 (comparable to first layer 602) and second layer 614 (comparable to second layer 604) after a structure has undergone thermal processing. Thermal processing of structure 601 generates, at the location of interface 606, a "poisoned" layer, in which the materials from the first layer 612 and the second layer 614 inter-diffuse to form a third material, or an interfacial layer 616, with properties between the properties of the first layer 612 and the second layer 614. Among the properties of the interfacial layer 616 between the properties of the first layer 612 and the second layer 614 are, among others, (1) chemical composition, and (2) lattice constant. The chemical composition of interfacial layer 616 ranges from the composition of first layer 612 at a top side of the interfacial layer 616, to the chemical composition of second layer 614 at the bottom side of the interfacial layer 616. The variation in chemical composition through the vertical thickness of interfacial layer 616 causes the lattice constant of the interfacial layer 616 film to vary through the vertical thickness of the interfacial layer 616. By inter-diffusing materials of two films into each other, the interficial layer 616 smoothly transitions a sidewall profile from the first layer 612 to the second layer 614 to remove a kink associated with different opening diameters in an interconnect opening (before metal deposition) at different layers of the metal hardmask (e.g., the metal/metallic layer, and one antireflective layer). In some embodiments, the first layer 612 is a metallic layer (a metal layer, or a metal nitride layer) and the second layer 614 is an antireflective layer. In some embodiments, the first layer 612 is an antireflective layer and the second layer 614 is a metallic layer. The thermal processing described in the method of the present disclosure works to smooth kinks at interfaces of a metallic layer and an antireflective layer, whether the antireflective layer of the metallic layer is on top in the film stack.

An aspect of this description relates to a method. The method includes depositing a metallic hardmask over a dielectric layer. The method further includes etching a metallic hardmask opening in the metallic hardmask to expose a top surface of the dielectric layer. The method further includes modifying a sidewall of the metallic hardmask opening by adding non-metal atoms into the metallic hardmask. The method further includes depositing a conductive material in the metallic hardmask opening. In some embodiments, adding non-metal atoms into the metallic hardmask includes adding nitrogen. In some embodiments, adding non-metal atoms into the metallic hardmask includes adding oxygen. In some embodiments, the method further includes annealing the metallic hardmask following adding the non-metal atoms. In some embodiments, annealing the metallic hardmask includes forming a poisoned layer having sloped sidewalls. In some embodiments, adding non-metal atoms into the metallic hardmask includes adding non-metal atoms into an entire sidewall of the metallic hardmask. In some embodiments, adding non-metal atoms into the metallic hardmask includes adding non-metal atoms into a portion of a sidewall of the metallic hardmask, and the portion of the sidewall is less than an entirety of the sidewall. In some embodiments, the method further includes depositing a seed layer in the metallic hardmask opening. In some embodiments, depositing the seed layer is performed prior to depositing the conductive material.

An aspect of this description relates to a method. The method includes depositing a metallic hardmask over a dielectric layer. The method further includes etching a metallic hardmask opening in the metallic hardmask to expose a top surface of the dielectric layer. The method further includes modifying a sidewall of the metallic hardmask opening by adding non-metal atoms into the metallic hardmask. The method further includes etching the dielectric layer using the metallic hardmask having a modified sidewall as a mask to define an opening. The method further includes depositing a conductive material in the opening. In some embodiments, modifying the sidewall includes adding nitrogen to the sidewall. In some embodiments, adding nitrogen to the sidewall includes adding nitrogen to less than an entirety of the sidewall. In some embodiments, modifying the sidewall further includes annealing the metallic hardmask. In some embodiments, etching the dielectric layer includes defining the opening having a non-uniform width. In some embodiments, etching the dielectric layer includes forming the opening including a first region having a first width and a second region having a second width less than the first width. In some embodiments, etching the dielectric layer includes defining a shoulder between the first region and the second region, and an angle of the shoulder ranges from 10-degrees to 70-degrees. In some embodiments, etching the dielectric layer includes defining the shoulder having an angle of greater than 20-degrees.

An aspect of this description relates to a semiconductor device. The semiconductor device includes a connector layer. The semiconductor device further includes a dielectric layer over the connector layer. The semiconductor device further includes a conductive element in the dielectric layer. The conductive element includes a first region having a first uniform width; a second region having a second uniform width, wherein the second uniform width is less than the first uniform width; and a shoulder between the first region and the second region, wherein an angle of the shoulder relative to a top surface of the connector layer is greater than 20-degrees and less than 70-degrees. In some embodiments, the second region directly contacts the connector layer. In some embodiments, the conductive element includes a seed layer; and a conductive material, wherein the seed layer is between the conductive material and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a metallic hardmask over a dielectric layer;
   etching a metallic hardmask opening in the metallic hardmask to expose a top surface of the dielectric layer;
   modifying a sidewall of the metallic hardmask opening by adding non-metal atoms into the metallic hardmask; and
   depositing a conductive material in the metallic hardmask opening.

2. The method of claim 1, wherein adding non-metal atoms into the metallic hardmask comprises adding nitrogen.

3. The method of claim 2, wherein adding non-metal atoms into the metallic hardmask comprises adding oxygen.

4. The method of claim 1, further comprising annealing the metallic hardmask following adding the non-metal atoms.

5. The method of claim 4, wherein annealing the metallic hardmask comprises forming a poisoned layer having sloped sidewalls.

6. The method of claim 1, wherein adding non-metal atoms into the metallic hardmask comprises adding non-metal atoms into an entire sidewall of the metallic hardmask.

7. The method of claim 1, wherein adding non-metal atoms into the metallic hardmask comprises adding non-metal atoms into a portion of a sidewall of the metallic hardmask, and the portion of the sidewall is less than an entirety of the sidewall.

8. The method of claim 1, further comprising depositing a seed layer in the metallic hardmask opening.

9. The method of claim 8, wherein depositing the seed layer is performed prior to depositing the conductive material.

10. A method, comprising:
    depositing a metallic hardmask over a dielectric layer;
    etching a metallic hardmask opening in the metallic hardmask to expose a top surface of the dielectric layer;
    modifying a sidewall of the metallic hardmask opening by adding non-metal atoms into the metallic hardmask;
    etching the dielectric layer using the metallic hardmask having a modified sidewall as a mask to define an opening; and
    depositing a conductive material in the opening.

11. The method of claim 10, wherein modifying the sidewall comprises adding nitrogen to the sidewall.

12. The method of claim 11, wherein adding nitrogen to the sidewall comprises adding nitrogen to less than an entirety of the sidewall.

13. The method of claim 11, wherein modifying the sidewall further comprises annealing the metallic hardmask.

14. The method of claim 10, wherein etching the dielectric layer comprises defining the opening having a non-uniform width.

15. The method of claim 10, wherein etching the dielectric layer comprises forming the opening comprising a first region having a first width and a second region having a second width less than the first width.

16. The method of claim 15, wherein etching the dielectric layer comprises defining a shoulder between the first region and the second region, and an angle of the shoulder ranges from 10-degrees to 70-degrees.

17. The method of claim 16, wherein etching the dielectric layer comprises defining the shoulder having an angle of greater than 20-degrees.

18. A method, comprising:
depositing a metallic hardmask over a dielectric layer, the depositing of the metallic hardmask including depositing an antireflective layer and a metallic layer;
forming an interfacial region in which components of the antireflective layer and the metallic layer are combined;
etching the metallic hardmask to define a first opening; and
depositing a conductive material in the first opening.

19. The method of claim 18, wherein forming the interfacial region comprises performing a thermal process on the metallic hardmask to diffuse elements between the antireflective layer and the metallic layer.

20. The method of claim 18, wherein forming the interfacial region comprises implanting non-metal atoms into a sidewall of the metallic hardmask.

* * * * *